United States Patent
Nandakumar et al.

(10) Patent No.: US 10,026,730 B2
(45) Date of Patent: Jul. 17, 2018

(54) SINGLE MASK LEVEL INCLUDING A RESISTOR AND A THROUGH-GATE IMPLANT

(71) Applicant: Texas Instruments Incorporated, Dallas, TX (US)

(72) Inventors: Mahalingam Nandakumar, Richardson, TX (US); Douglas Tad Grider, III, McKinney, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/669,246

(22) Filed: Aug. 4, 2017

(65) Prior Publication Data

US 2017/0338223 A1 Nov. 23, 2017

Related U.S. Application Data

(62) Division of application No. 15/060,261, filed on Mar. 3, 2016, now Pat. No. 9,761,581.

(51) Int. Cl.
*H01L 29/76* (2006.01)
*H01L 29/94* (2006.01)
(Continued)

(52) U.S. Cl.
CPC ........ *H01L 27/0635* (2013.01); *H01L 21/266* (2013.01); *H01L 21/26513* (2013.01); *H01L 21/28035* (2013.01); *H01L 21/32155* (2013.01); *H01L 21/8238* (2013.01); *H01L 21/8249* (2013.01); *H01L 27/0629* (2013.01); *H01L 27/0922* (2013.01); *H01L 28/20* (2013.01);
(Continued)

(58) Field of Classification Search
None
See application file for complete search history.

(56) References Cited

U.S. PATENT DOCUMENTS 4,902,640 A 2/1990 Sachitano et al.
5,139,966 A 8/1992 Jerome et al.
(Continued)

*Primary Examiner* — Thien F Tran
(74) *Attorney, Agent, or Firm* — Jacqueline J. Garner; Charles A. Brill; Frank D. Cimino

(57) ABSTRACT

A method of forming an IC includes providing a field dielectric in a portion of a semiconductor surface, a bipolar or Schottky diode (BSD) class device area, a CMOS transistor area, and a resistor area. A polysilicon layer is deposited to provide a polysilicon gate area for MOS transistors in the CMOS transistor area, over the BSD class device area, and over the field dielectric for providing a polysilicon resistor in the resistor area. A first mask pattern is formed on the polysilicon layer. Using the first mask pattern, first implanting ($I_1$) of the polysilicon resistor providing a first projected range ($R_{P1}$)<a thickness of the polysilicon layer and second implanting ($I_2$) providing a second $R_P(R_{P2})$, where $R_{P2}$>$R_{P1}$. $I_2$ provides a CMOS implant into the semiconductor surface layer in the CMOS transistor area and/or a BSD implant into the semiconductor surface layer in the BSD area.

19 Claims, 16 Drawing Sheets

(51) Int. Cl.
  *H01L 31/062*   (2012.01)
  *H01L 31/113*   (2006.01)
  *H01L 31/119*   (2006.01)
  *H01L 27/06*    (2006.01)
  *H01L 29/732*   (2006.01)
  *H01L 27/092*   (2006.01)
  *H01L 49/02*    (2006.01)
  *H01L 29/06*    (2006.01)
  *H01L 29/66*    (2006.01)
  *H01L 29/167*   (2006.01)
  *H01L 29/08*    (2006.01)
  *H01L 29/10*    (2006.01)
  *H01L 21/8238*  (2006.01)
  *H01L 21/266*   (2006.01)
  *H01L 21/265*   (2006.01)
  *H01L 21/3215*  (2006.01)
  *H01L 21/28*    (2006.01)
  *H01L 21/8249*  (2006.01)

(52) U.S. Cl.
  CPC .......... *H01L 28/60* (2013.01); *H01L 29/0649* (2013.01); *H01L 29/0804* (2013.01); *H01L 29/0847* (2013.01); *H01L 29/1004* (2013.01); *H01L 29/167* (2013.01); *H01L 29/66143* (2013.01); *H01L 29/66272* (2013.01); *H01L 29/66545* (2013.01); *H01L 29/66575* (2013.01); *H01L 29/732* (2013.01)

(56) References Cited

U.S. PATENT DOCUMENTS

| | | |
|---|---|---|
| 5,414,291 A | 5/1995 | Miwa et al. |
| 6,351,021 B1 | 2/2002 | Hemmenway et al. |
| 8,927,385 B2 | 1/2015 | Nandakumar et al. |
| 2003/0157778 A1 | 8/2003 | Hemmenway et al. |
| 2007/0246780 A1* | 10/2007 | Watanabe .......... H01L 27/0629 257/368 |
| 2010/0178740 A1 | 7/2010 | Kohli |

* cited by examiner

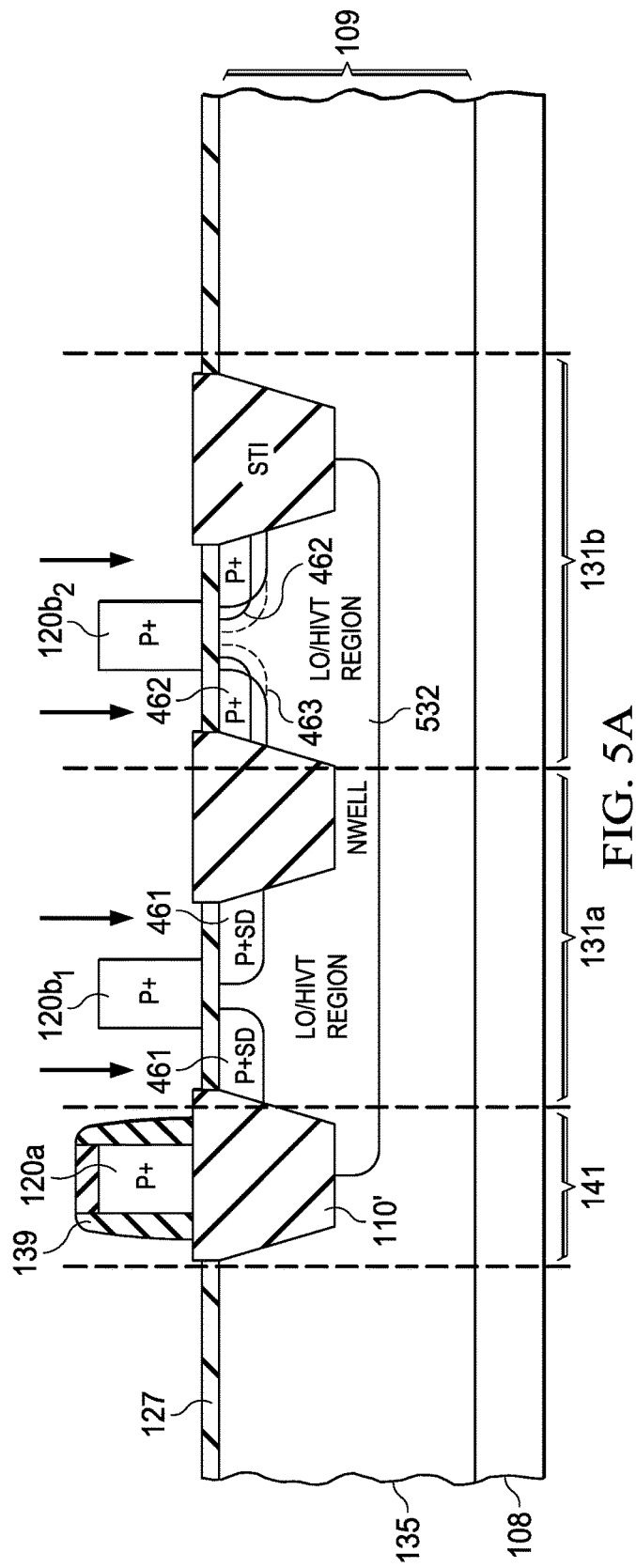

SINGLE MASK LEVEL INCLUDING A RESISTOR AND A THROUGH-GATE IMPLANT

CROSS REFERENCE TO RELATED APPLICATIONS

This application is a divisional of U.S. Nonprovisional Patent Application serial no. 15/060,261, filed Mar. 03, 2016, the contents of which is herein incorporated by reference in its entirety.

FIELD

Disclosed embodiments relate to BiCMOS semiconductor processing.

BACKGROUND

BiCMOS technology combines bipolar technology and CMOS technology. CMOS technology offers lower power dissipation, smaller noise margins, and higher packing density. Bipolar technology provides high switching and input/output I/O speed and good noise performance. BiCMOS technology accomplishes improved speed over CMOS and lower power dissipation as compared to bipolar technology.

If existing CMOS implants are used for bipolar devices, then the bipolar gain or some other parameter or feature is generally compromised. Accordingly, a drawback of adding bipolar transistors in a CMOS process flow is extra mask levels and implants needed to provide good performance for both the bipolar devices and CMOS devices. The extra mask levels results in a process cost increase and added defect density as compared to conventional CMOS technology.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include a BiCMOS process flow that includes using a single mask level for ion implanting a polysilicon layer for forming a polysilicon resistor on top of a field dielectric and also a deeper p-type (e.g. boron) or an n-type (e.g., phosphorus) dopant implant that penetrates thru the polysilicon layer (referred to herein as being a "thru-gate implant") into the semiconductor surface layer thereunder. The thru-gate implant can provide a second pwell/nwell and/or a deep nwell for CMOS devices. The thru-gate implant can also be used to form a bipolar or Schottky diode (BSD) device, including the base of a vertical NPN or vertical PNP bipolar transistor. As the polysilicon resistor is generally on top of field oxide, the thru-gate implant despite penetrating thru the polysilicon layer into the underlying field oxide is a harmless fingerprint for disclosed methods.

Disclosed embodiments contain a method of forming an integrated circuit (IC) including providing a field dielectric in a portion of a semiconductor surface layer, a bipolar or Schottky diode (BSD) class device area, a CMOS transistor area, and a resistor area. A polysilicon layer is deposited over a CMOS transistor area for providing polysilicon gates for MOS transistors and capacitors in the CMOS transistor area, over the BSD class device area, and over the field dielectric for providing a polysilicon resistor in the resistor area. A first mask pattern is formed on the polysilicon layer. Using the first mask pattern, first implanting ($I_1$) the polysilicon resistor providing a first projected range ($R_{P1}$)<a thickness of the polysilicon layer and second implanting ($I_2$) providing a second $R_P(R_{P2})$, where $R_{P2}$>$R_{P1}$ . $I_2$ provides a CMOS implant into the semiconductor surface layer in the CMOS transistor area and/or a BSD implant into the semiconductor surface layer in the BSD area.

BRIEF DESCRIPTION OF THE DRAWINGS

Reference will now be made to the accompanying drawings, which are not necessarily drawn to scale, wherein:

FIGS. 5A-5B show a variant of the process flow shown in FIGS. 4A-4D for forming both replacement metal gate low threshold voltage (Vt) and high Vt PMOS transistors, according to an example embodiment.

DETAILED DESCRIPTION

Figure 1:
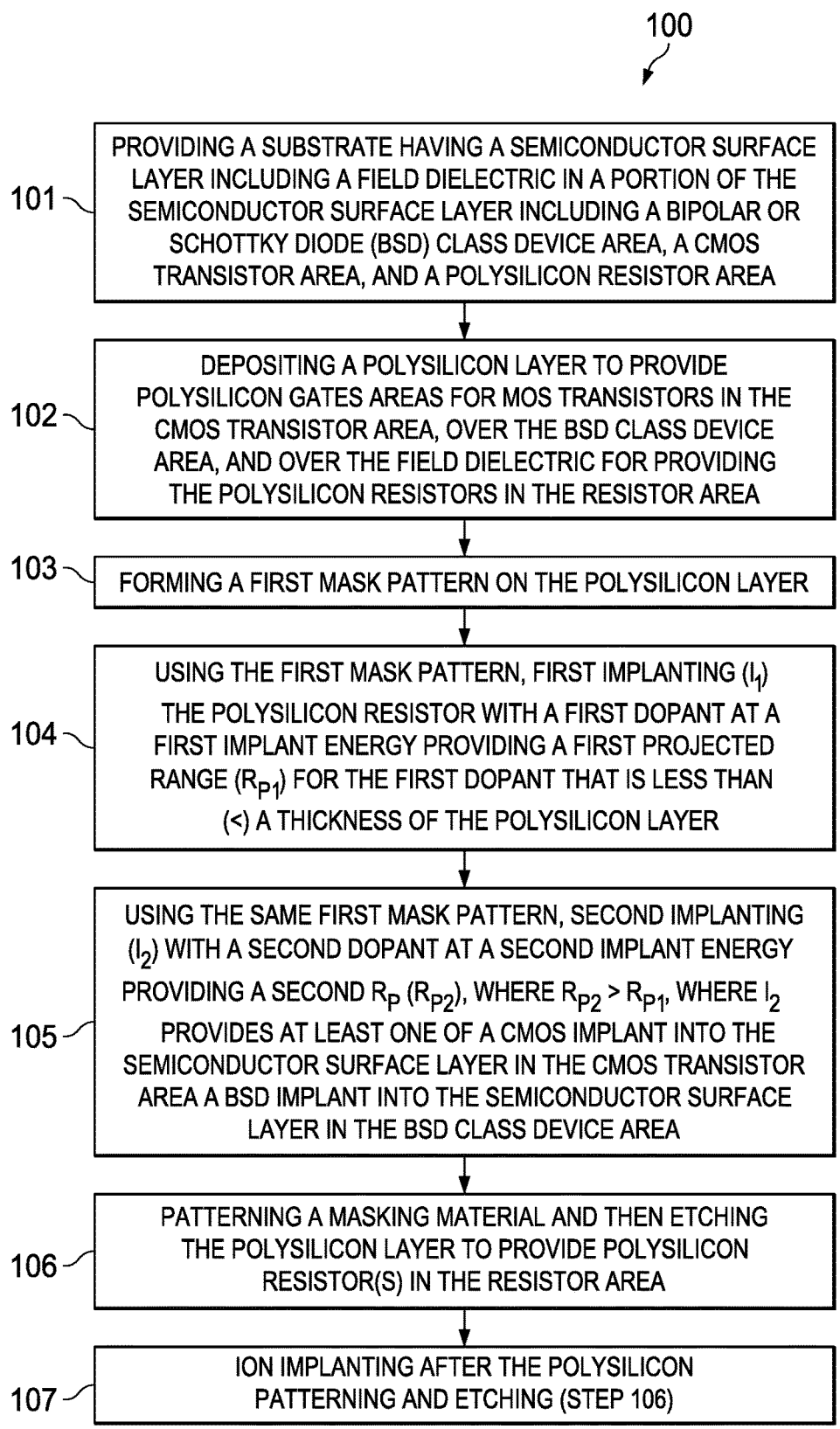
FIG. 1 is a flow chart that shows steps in an example method for forming a BICMOS integrated circuit (IC) including a single mask level including both a polysilicon resistor implant and a thru-gate implant, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 for forming a BICMOS integrated circuit (IC) comprising a single mask level having both a polysilicon resistor implant and a thru-gate ion implant, according to an example embodiment. As known in the art, BiCMOS technology is a combination of CMOS and Bipolar technologies.

Step 101 comprises providing a substrate having at least a semiconductor surface layer including a field dielectric on or in a portion of the semiconductor surface layer including a bipolar or Schottky diode (BSD) class device area where BSD class devices are formed, a CMOS transistor area where NMOS and PMOS transistors (MOS transistors) and capacitors are formed, and a resistor area where polysilicon resistors are formed. BSD class devices as used herein include silicon controlled rectifiers (SCRs), bipolar junction transistor (BJTs), pn junction (simple diode), junction fieldeffect transistor (JFETs), and Schottky diodes (semiconductor-metal junction). The substrate 108 and/or semiconductor surface layer 109 can comprise silicon, silicon-germanium, or other semiconductor material. One particular arrangement is a silicon/germanium (SiGe) semiconductor surface layer 5 on a silicon substrate.

The field dielectric can comprise a LOCal Oxidation of Silicon (LOCOS) oxide or a trench isolation structure such as shallow trench isolation (STI) or deep trench isolation (DTI). A thickness of the field dielectric can be from 0.1 µm to 3 µm.

Step 102 comprises depositing a polysilicon layer over a CMOS transistor area to provide polysilicon gate areas for MOS transistors and capacitors in the CMOS transistor area, over the BSD class device area, and over the field dielectric for providing the polysilicon resistors in the resistor area. The polysilicon deposition is generally a blanket deposition that is deposited on a grown/deposited gate dielectric layer, such as a layer of silicon oxide. A thickness of the polysilicon layer is generally from 0.05 µm to 0.25 µm, such as from 0.08 µm to 0.12 µm.

Step 103 comprises forming a first mask pattern on the polysilicon layer. Photoresist or a hard mask material may be used as the masking material. In known processes, the resist (or hard mask) of the polysilicon resistor mask pattern covers the entire die except the die regions where the polysilicon resistor is to be formed. In contrast, in step 103 the masking material also includes openings so that the second implanting ($I_2$) in step 105 described below implants through the polysilicon into the BSD class device area where the BSD class devices are formed to add a doped layer and/or implants into the CMOS transistor area where MOS devices are formed in a through-gate implant, such as to perform a threshold voltage (Vt) adjust implant for MOS devices.

Step 104 comprises using the first mask pattern, first implanting ($I_1$) the polysilicon resistor with a first dopant at a first implant energy providing a first projected range ($R_{P1}$) for the first dopant that is less than (<) a thickness of the polysilicon layer. $I_1$ generally comprises a boron/arsenic/phosphorus implant at a dose>$10^{14}$ cm$^{-2}$ leading to an average doping concentration in polysilicon resistor for the final IC of at least $10^{19}$ cm$^{-3}$. The species and dose of implant species for $I_1$ may be chosen such that the temperature coefficient of the polysilicon resistance is close to zero parts per million (ppm). For example, a boron dose of>$1\times10^{15}$ cm$^{-2}$ such as about $3\times10^{15}$ cm$^{-2}$ to $5\times10^{15}$ cm$^{-2}$ with a polysilicon thickness of 50 nm to 250 nm such as 80 nm to 120 nm can result in a Zero Temperature Coefficient Resistor (ZTCR) defined herein to have a TCR at 25° C. of from −100 ppm to +100 ppm.

Step 105 comprises using the same first mask pattern, second implanting ($I_2$) with a second dopant at a second implant energy providing a second $R_P$($R_{P2}$), where $R_{P2}>R_{P1}$, where $I_2$ provides at least one of a CMOS implant into the semiconductor surface layer 109 in the CMOS transistor area and a BSD implant into the semiconductor surface layer 109 in the BSD class device area. $R_{P2}$ is generally>the thickness of the polysilicon layer. Step 105 ($I_2$) can be performed before or after step 104 ($I_1$).

Step 106 comprises patterning a masking material to form a second mask pattern and then etching the polysilicon layer to provide polysilicon resistor(s) in the resistor area. The polysilicon layer etching can also be used to define polysilicon gate areas for NMOS devices and/or for PMOS devices and/or polysilicon capacitors in the CMOS device area(s). Step 107 comprises ion implanting after the polysilicon patterning and etching (step 106). The ion implanting in step 107 includes one or more dopants, and optionally also nitrogen or fluorine co-implants for CMOS devices. Subsequent process steps general include contact, metallization (e.g., multi-layer metallization), and passivation.

FIGS. 2A-2D shows cross sectional depictions of a process progression for an example method for forming a BiCMOS IC including a single mask level having both a polysilicon resistor implant and a thru-gate implant, according to an example embodiment. The depiction shown in FIG. 2A corresponds to method 100 after step 103 (forming a first mask pattern material 112). First mask pattern material 112 blocks areas including a portion of the second pwell 132 corresponding the channel region of a later formed NMOS device and later formed contacts to the nwell 135. First mask pattern material 112 is shown with openings over a resistor area 141 where polysilicon resistors are formed, over a BSD class device area 121 where BSD class devices are formed, and over a CMOS device area 131 where NMOS transistors and PMOS transistors (MOS transistors), as well as polysilicon capacitors (poly capacitors) are formed. The field dielectric is shown as shallow trench isolation (STI) 110' formed into a semiconductor surface layer 109 on a substrate 108. STI 110' generally surrounds each device. A polysilicon layer 120 is shown on a dielectric layer 127 that is on the semiconductor surface layer 109.

Figure 2A:
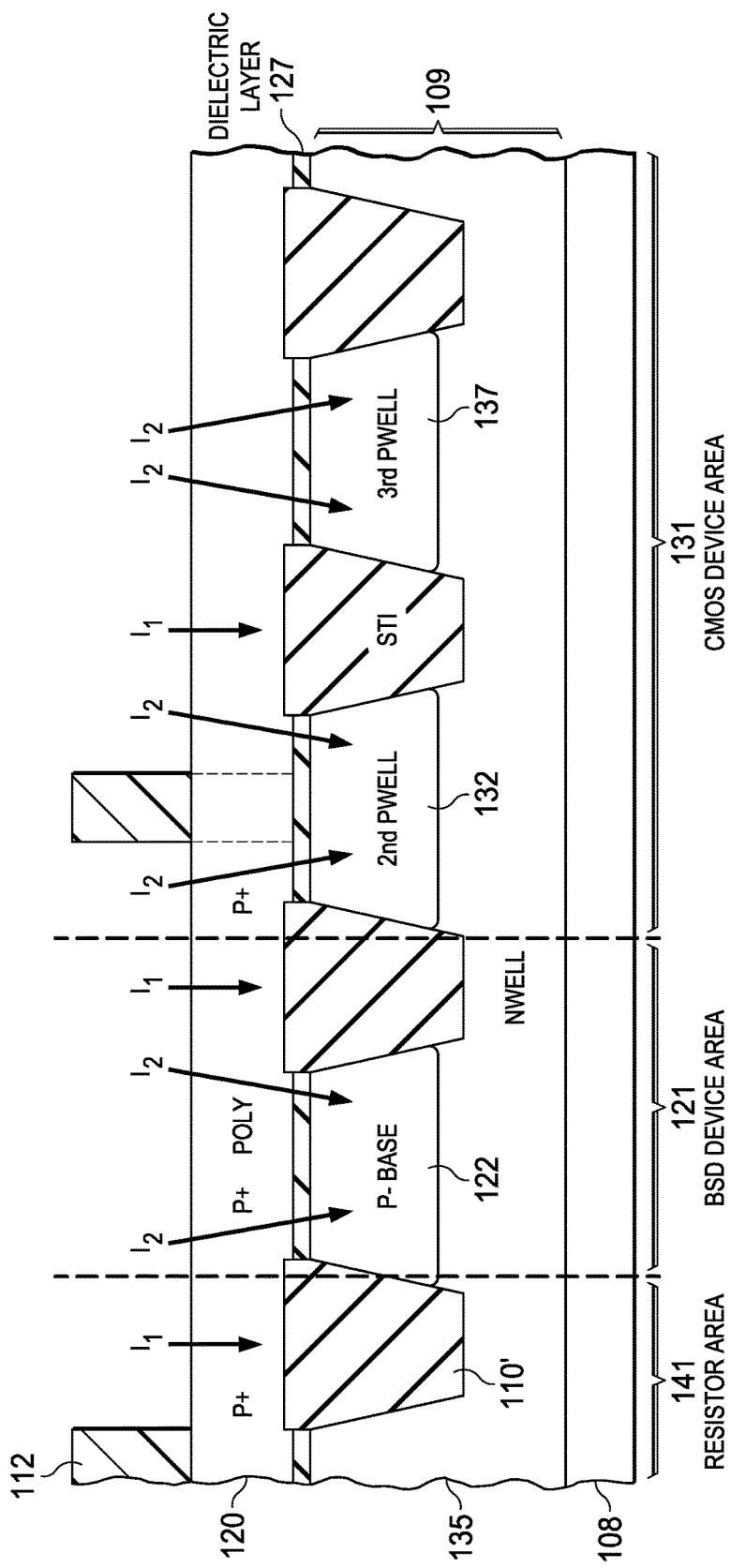
FIGS. 2A-2D shows cross sectional depictions of a process progression for an example method for forming a BiCMOS IC including a single mask level having both a resistor implant and a thru-gate implant, according to an example embodiment.

Two implants are shown in FIG. 2A, $I_1$(step 104) and $I_2$(step 105). As noted above $I_1$ has a projected range $R_{P1}$ that is<a thickness of the polysilicon layer 120 which implants the polysilicon layer 120 (shown P$^+$ doped) except where the first mask pattern material 112 is present. $I_2$ is shown as a thru-gate boron implant which provides the p-dopant for a pbase 122 of an NPN bipolar transistor within the nwell 135 in the BSD device area 121 and p-dopant for a second pwell 132 and a third pwell 137 within the nwell 135 in the CMOS device area 131. The $I_2$ implant to form the second pwell 132 and third pwell 137 is shown with a mask pattern comprising the first mask pattern material 112 covering the polysilicon gate area and lateral to the resistor area 141 as shown to enable a nwell contact, where $I_2$ is shown as a tilted implant which can be from 2 degrees to 45 degrees for forming the second pwell 132.

The p-type/nwell junction is shown above the bottom of the field dielectric shown as STI 110'. Thus, as shown in FIG. 2A, both $I_1$ and $I_2$ comprise boron implantation. However, $I_2$ can be a thru-gate n-type (e.g., phosphorus) implant to create an n-base for a PNP bipolar, or a second nwell within a p-region (e.g., pwell) in the CMOS device area 131. One can also perform both boron and phosphorous thru-gate implants in the same regions to form vertical diffusion resistors.

Figure 2B:
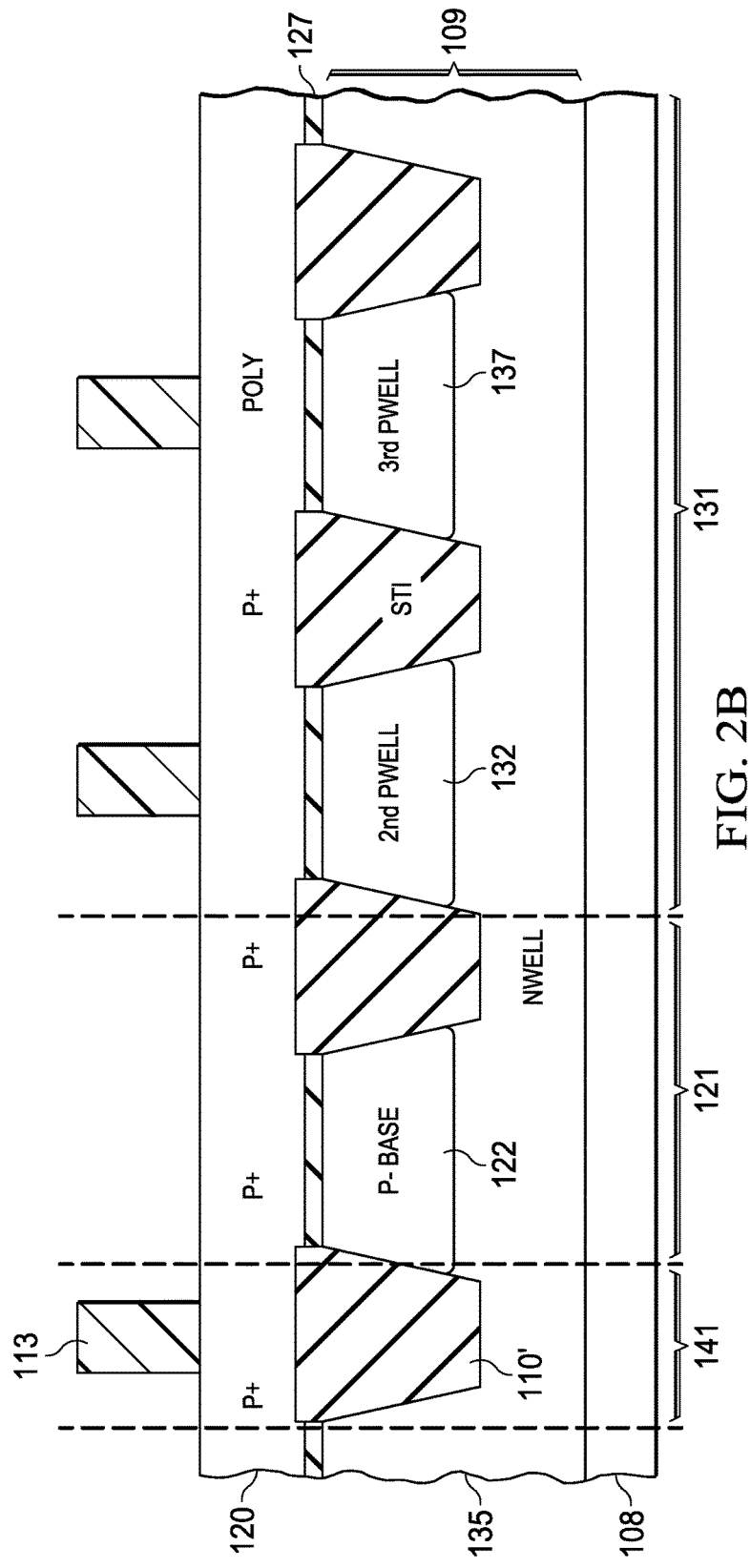
Figure 2C:
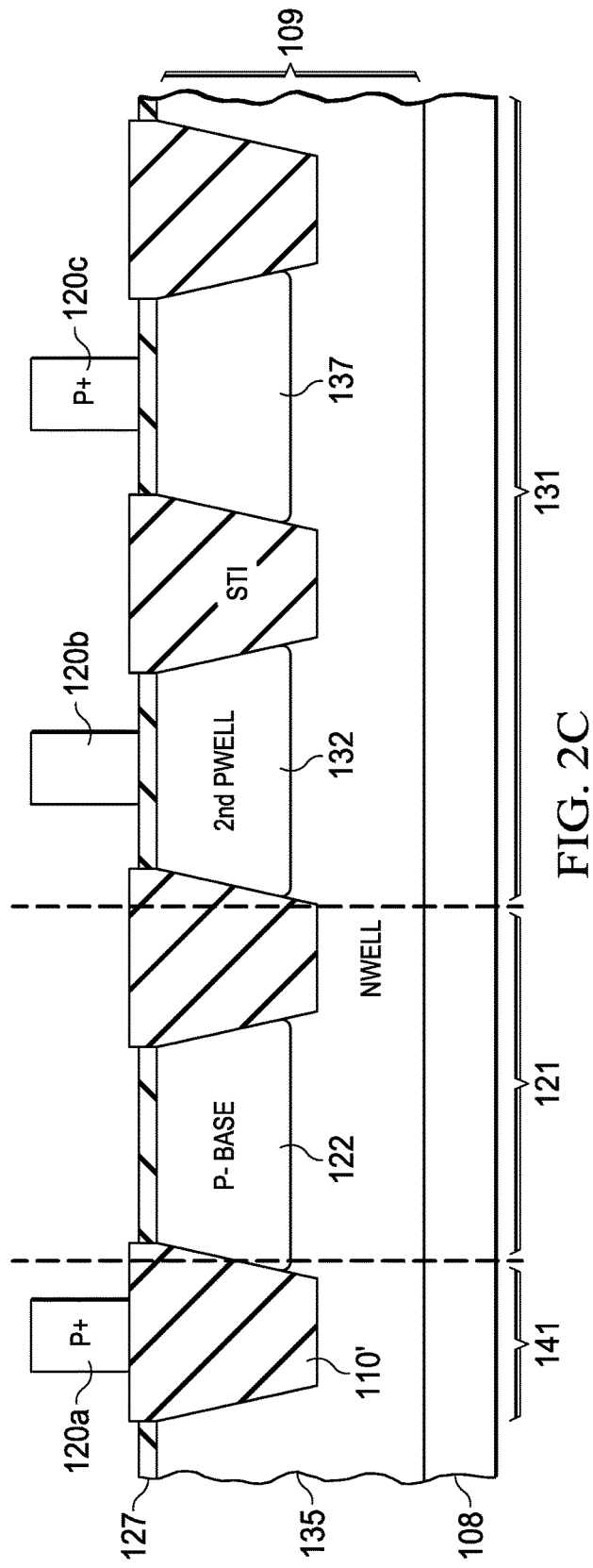

FIG. 2B shows the first mask pattern material 112 removed and a polysilicon mask pattern material 113 formed on portions of the polysilicon layer 120. FIG. 2C shows the polysilicon layer 120 after etching to provide at least a polysilicon resistor 120a (corresponding to step 106) in the resistor area 141 and a polysilicon electrode 120c for the poly capacitor in the CMOS device area 131. The polysilicon that will later be the gate electrode 120b for an NMOS device in the CMOS device area 131 is also shown formed.

Figure 2D:
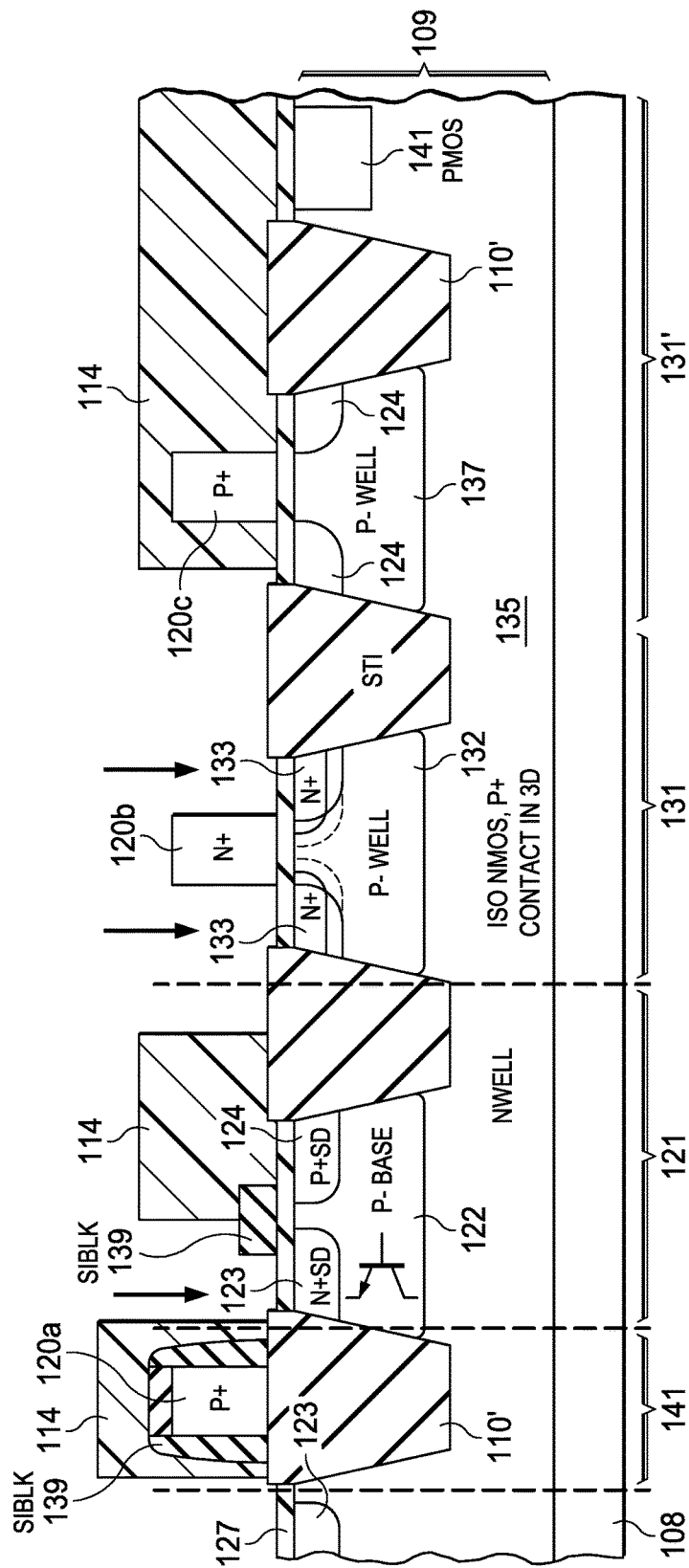

FIG. 2D shows arrows representing an n+ SD implant (after a P+ implant to form a p+ base contact (base contact) 124 for the NPN bipolar transistor (shown as P+SD) in the BSD device area 121 and a p+ pwell contact (not shown) for the NMOS transistor in the CMOS device area 131) to provide the n+emitter 123 for an NPN bipolar transistor in the BSD device area 121 and an n+ SD implant for forming n+ SDs 133 for an NMOS transistor in the CMOS device area 131. As shown, the polysilicon resistor 120a in the resistor area 141 and the area around the poly capacitor comprising polysilicon electrode 120c, and base contact 124 is masked by the masking material 114.

In the example shown in FIG.2D, the body of poly resistor 120a is covered by a silicide block (SIBLK) layer 139 (e.g. silicon nitride) which prevents silicide formation and enables obtaining high value sheet resistance (~100 to 5,000 ohms/sq). The head portion of the poly resistor 120a (not shown in the figure) is typically not covered by the SIBLK layer 139 to enable low resistance contacts to be formed. The SIBLK layer 139 also electrically separates the n+ emitter 123 and base contact 124 of the NPN bipolar transistor shown in FIG. 2.D. In one embodiment, the SIBLK layer 139 can be formed prior to the n+ and p+ SD implants and act as an implant mask for the NPN transistor. In another embodiment the SIBLK layer 139 can be formed after the source-drain implants. The SIBLK layer 139 typically remains on the final IC but can also be removed after silicide formation. A PMOS transistor 141 is also shown as a block in CMOS device area 131'. The gate electrodes of PMOS transistor 141 and poly capacitor 120a can be made from the same p+ doped polysilicon layer as polysilicon resistor 120a.

Figure 3A:
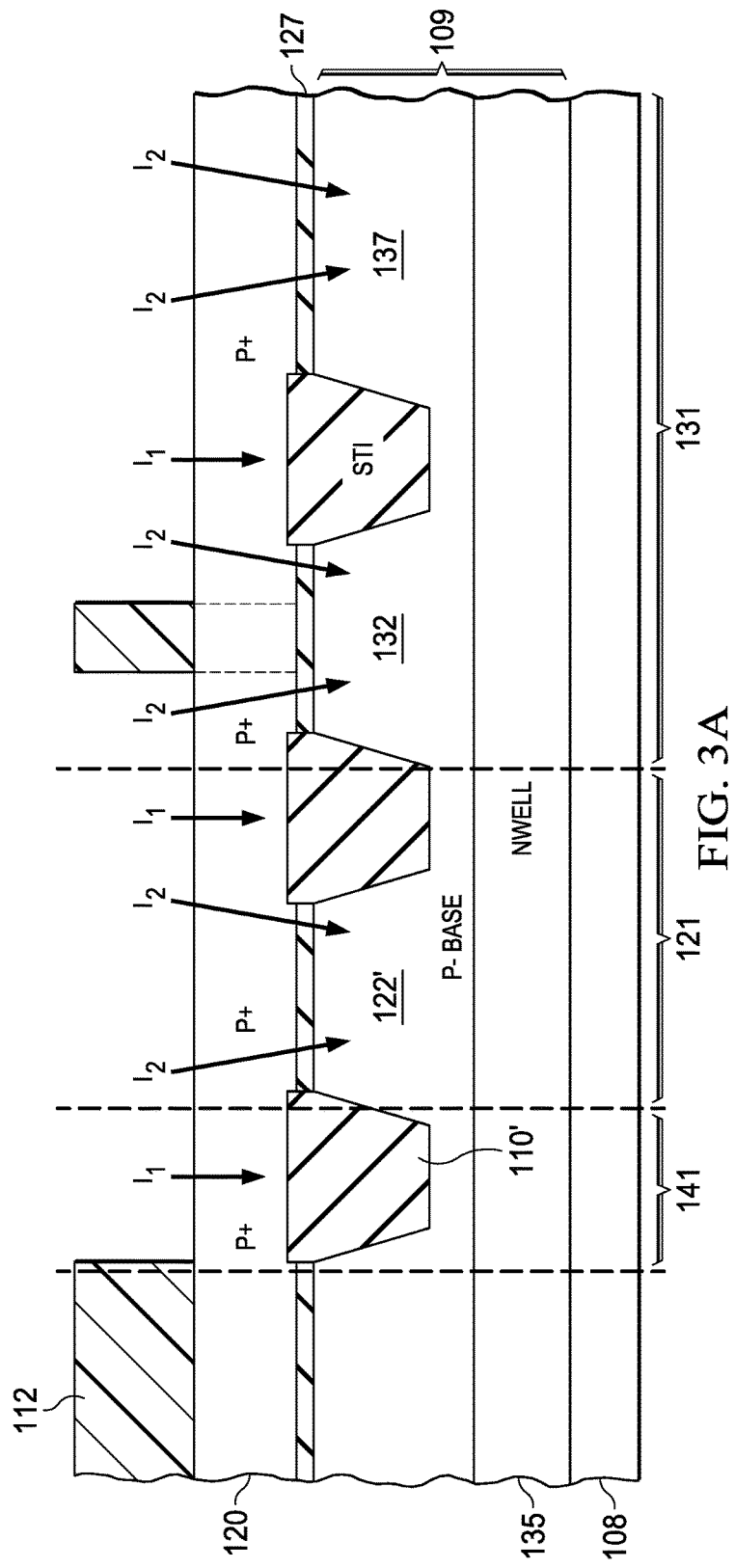
FIGS. 3A-3D shows cross sectional depictions of a process progression for an example method for forming a BiCMOS IC including a single mask level having both a resistor implant and a thru-gate ion implant, according to an another example embodiment.
Figure 3B:
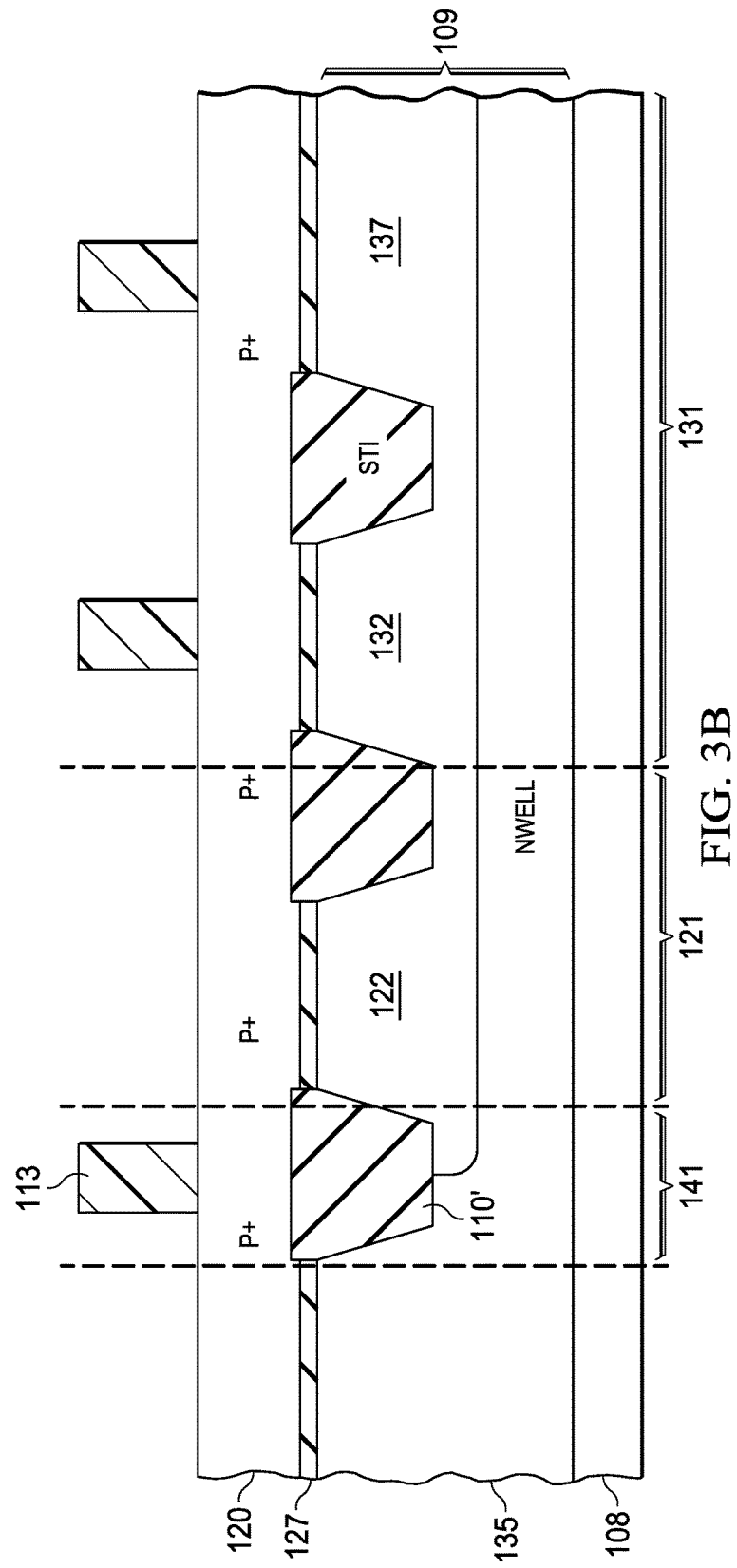
Figure 3C:
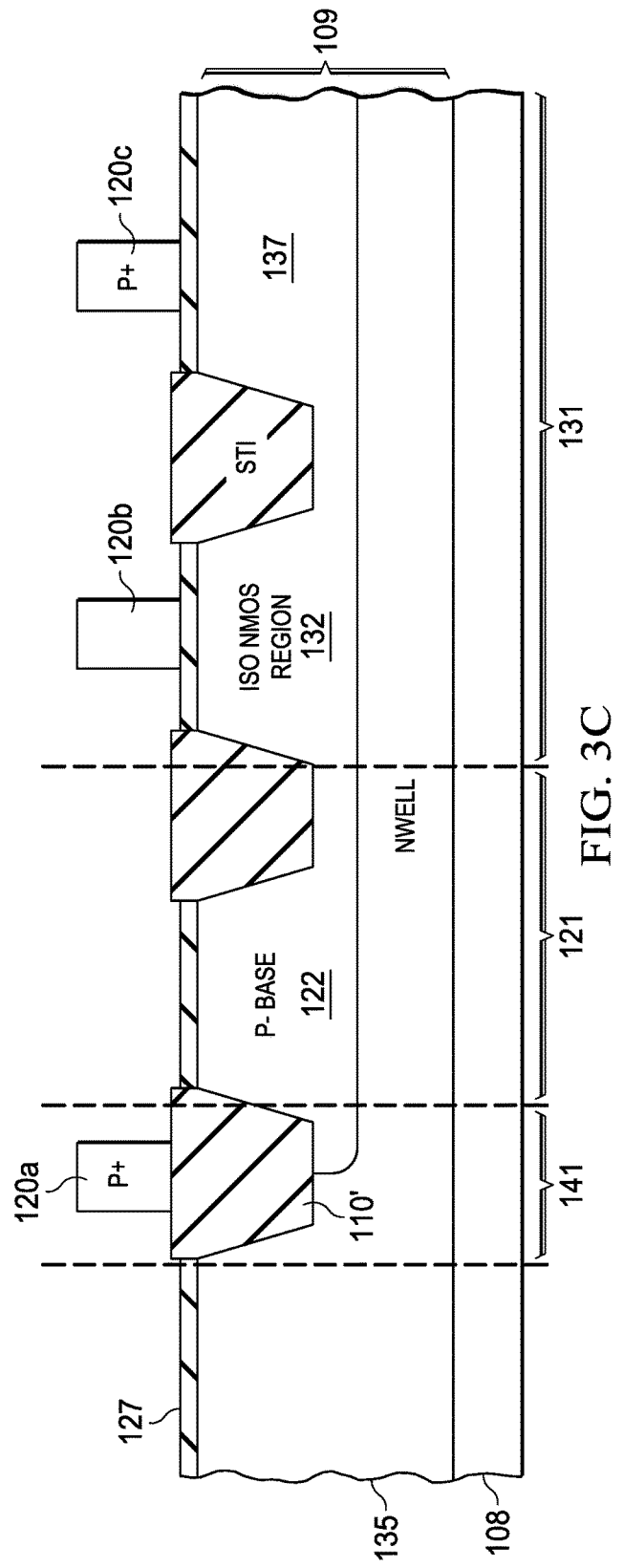

FIGS. 3A-3D shows cross sectional depictions of a process progression for an example method for forming a BiCMOS IC including a single mask level having both a polysilicon resistor implant and a thru-gate ion implant, according to an another example embodiment. FIG. 3A follows FIG. 2A except the thru-gate implant ($I_2$) provides a junction depth that is below the depth of the STI 110'. FIG. 3B follows FIG. 2B, and FIG. 3C follows FIG. 2C.

Figure 3D:
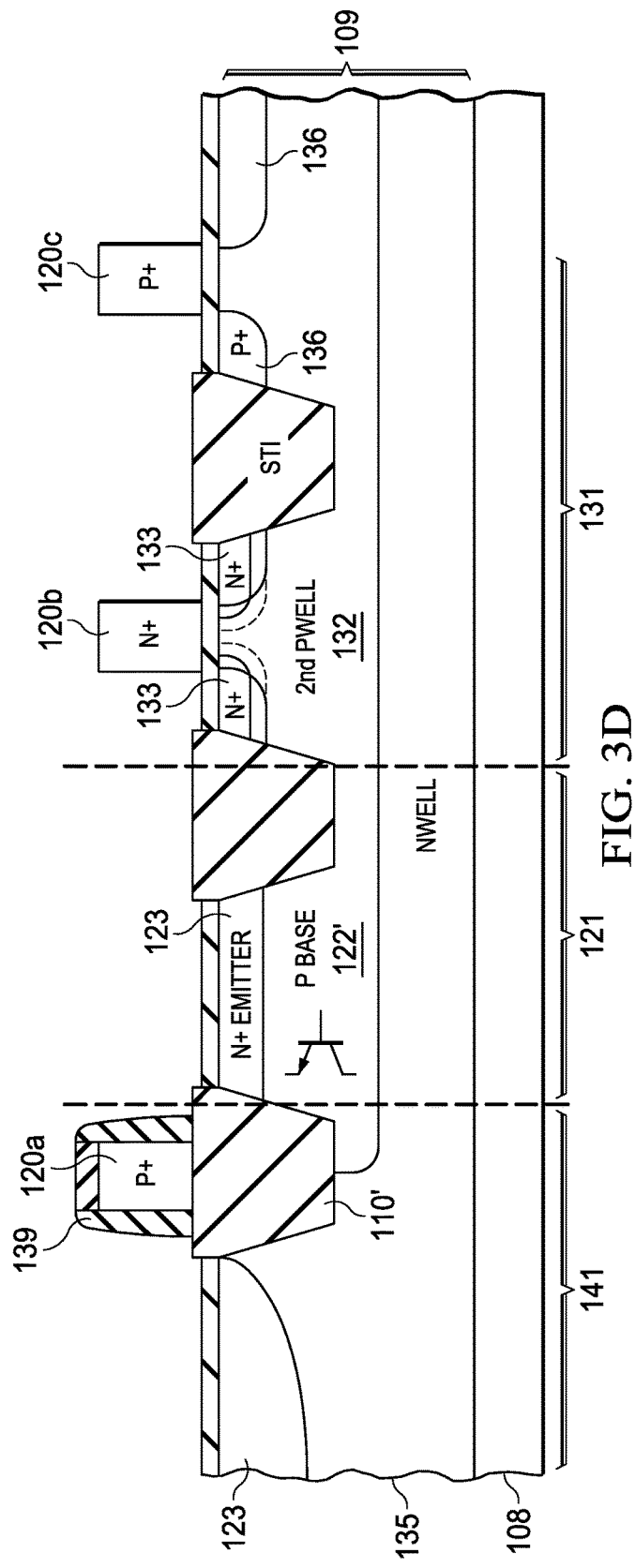

FIG. 3D follows FIG. 2D except there is another p-well contact 136 shown provided for the NMOS transistor in the $3^{rd}$ pwell 137 of the CMOS device area 131. As the $_A$-base 122' for the NPN transistor in FIG. 3D is wider as compared the p-base 122 for the NPN transistor shown in FIG. 2D, the NPN transistor in FIG. 3D is a lower gain NPN transistor. As with the flow shown relative to FIGS. 2A-2D, $I_2$ can be a thru-gate n-type (e.g., phosphorus) implant to create an n-base for a PNP bipolar transistor, or a second nwell within a p-region (e.g., pwell) in the CMOS device area 131. Moreover, as noted above, one can also perform boron and phosphorous thru-gate implants in the same regions to form diffusion resistors.

FIGS. 4A-4D shows cross sectional depictions of a process progression for an example method for forming a BiCMOS IC including a single mask level having both a polysilicon resistor implant and a thru-gate implant, according to an yet another example. In this embodiment the thru-gate implant is for forming both low Vt and/high Vt MOS transistor using an angled n-type (e.g., phosphorous) or boron implant. Although a BSD class device area 121 is also present for this process embodiment as with other embodiments, such as where bipolar transistors are formed, it is not shown in FIGS. 4A-4D.

Figure 4A:
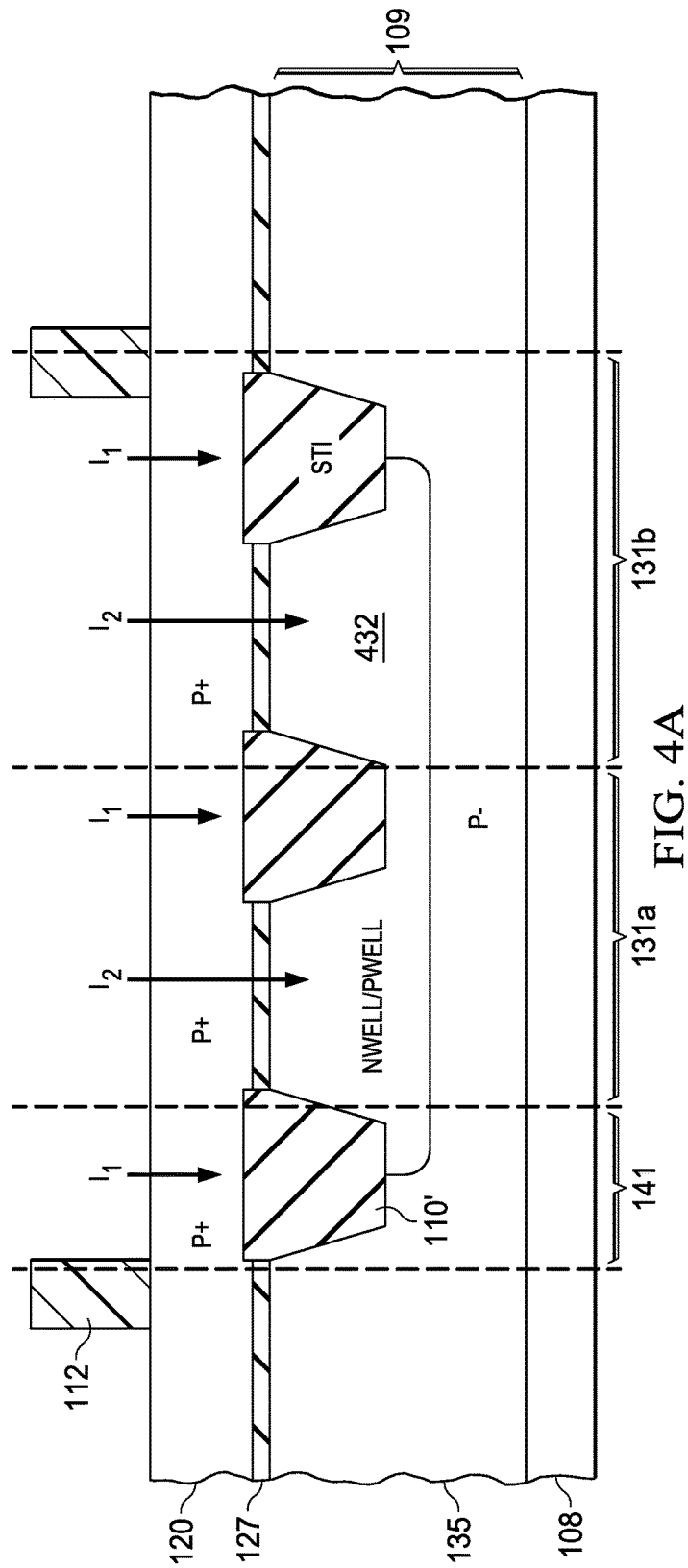
FIGS. 4A-4D shows cross sectional depictions of a process progression for an example method for forming a BiCMOS IC including a single mask level having both a resistor implant and a thru-gate implant, according to an yet another example embodiment.
Figure 4B:
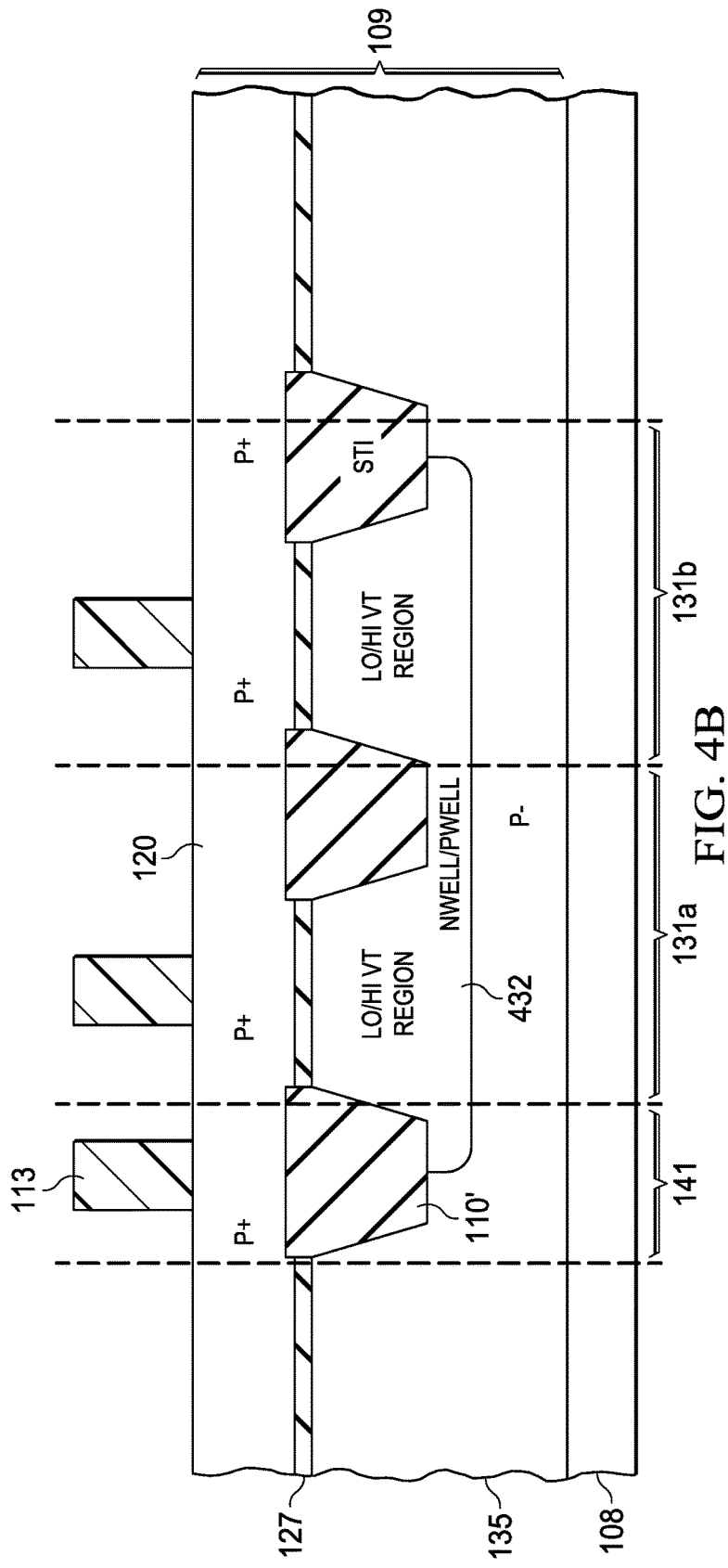
Figure 4C:
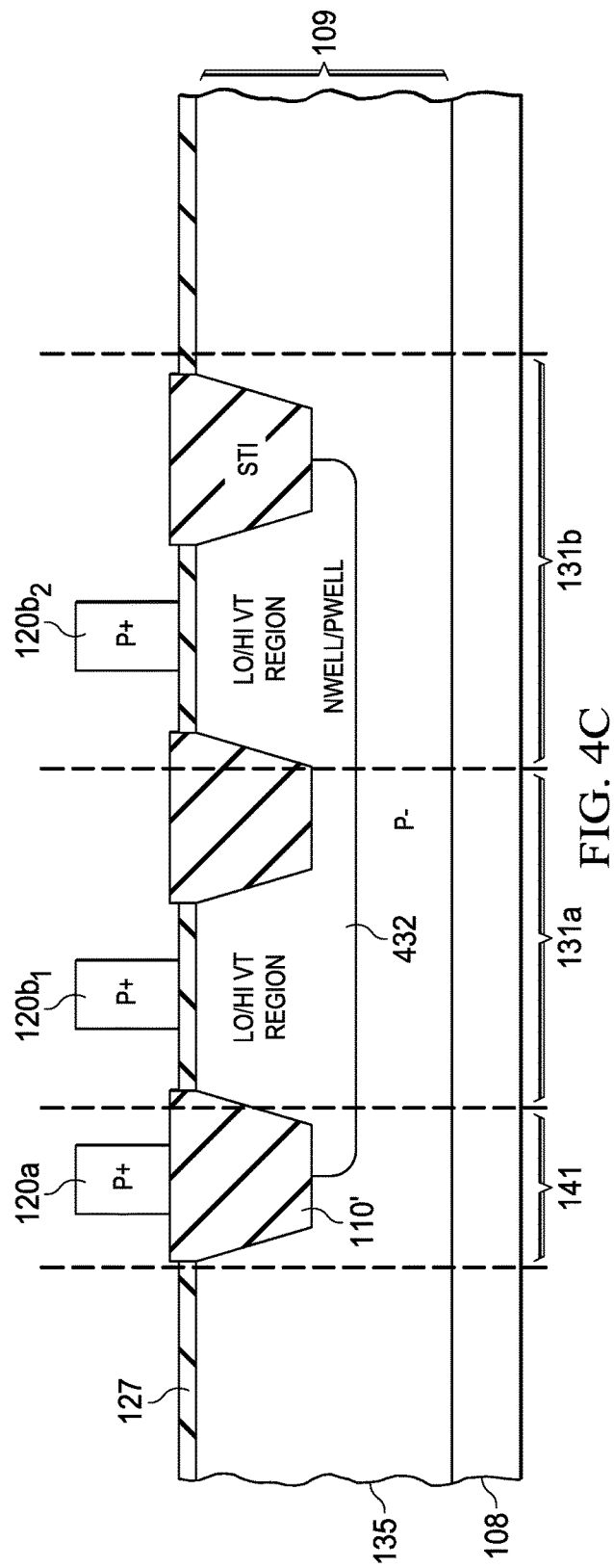

FIG. 4A follows FIG. 2A except the semiconductor surface layer 109 is shown being p-type and $I_2$ (the thru-gate implant) can be an n-type implant to form an nwell or a p-type implant to form a pwell shown as nwell/pwell 432. FIG. 4B follows FIG. 2B except now the polysilicon mask pattern material 113 is on the polysilicon layer 120 over two different CMOS device areas shown as CMOS device area 131a and the CMOS device area 131b. FIG. 4C follows FIG. 2C except the gates are now shown as gate $120b_1$ over CMOS device area 131a and gate $120b_2$ over the CMOS device area 131b.

Figure 4D:
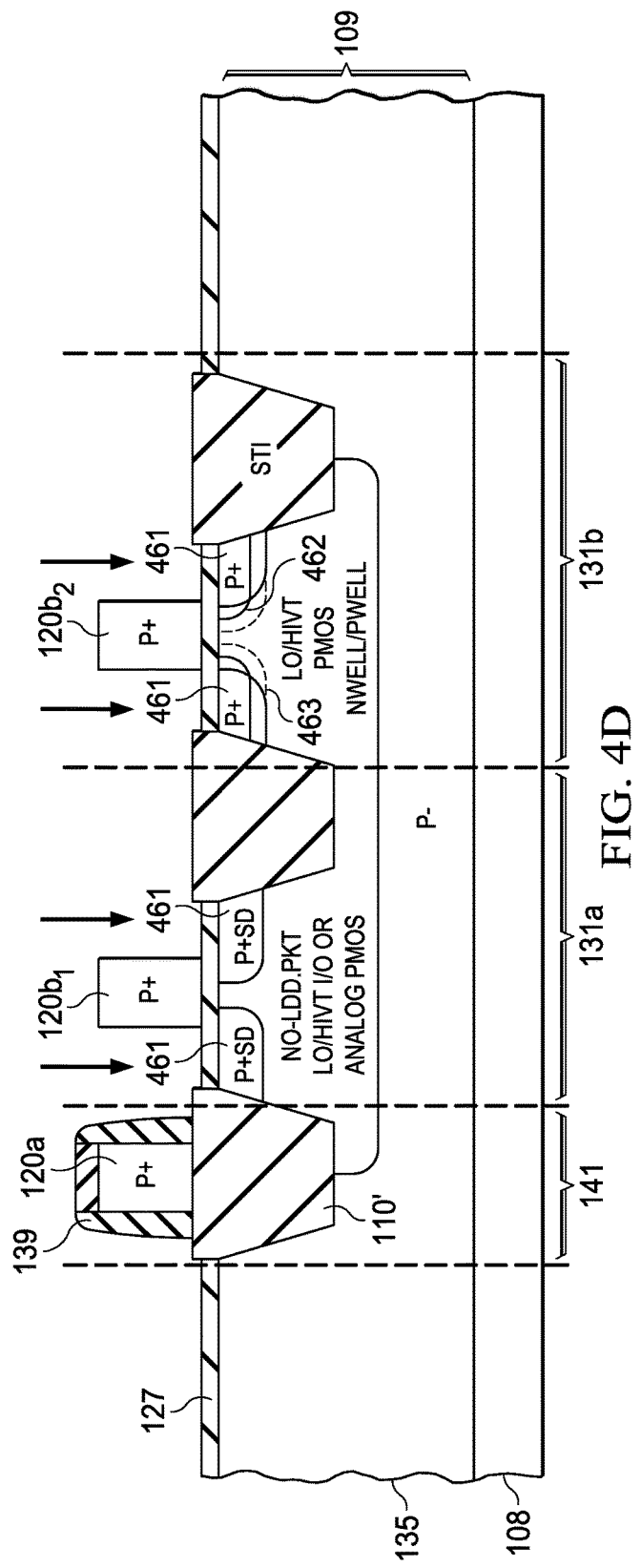

FIG. 4D follows FIG. 2D except the MOS devices are both shown as PMOS devices and p+ SD regions 461 formed in both CMOS device area 131a and CMOS device area 13 lb. The PMOS device having gate $120b_1$ in CMOS device area 131a receives a PSD implant to form PSD regions 461, while the MOS device having gate $120b_2$ in CMOS device area 131b receives the PSD implant to form PSD regions 461, as well as a PLDD implant to form PLDD region 462 and an angled pocket implant to form pocket region 463. The CMOS device area 131a is masked to prevent the PLDD and pocket implants. The addition of the PLDD implant to form PLDD region 462 and angled pocket implant to form pocket region 463 in CMOS device area 131b results in a Vt difference between the PMOS devices in CMOS device area 131a and the PMOS devices in CMOS device area 131b, such as a difference in Vt of at least (>) 50 mV.

Figure 5B:
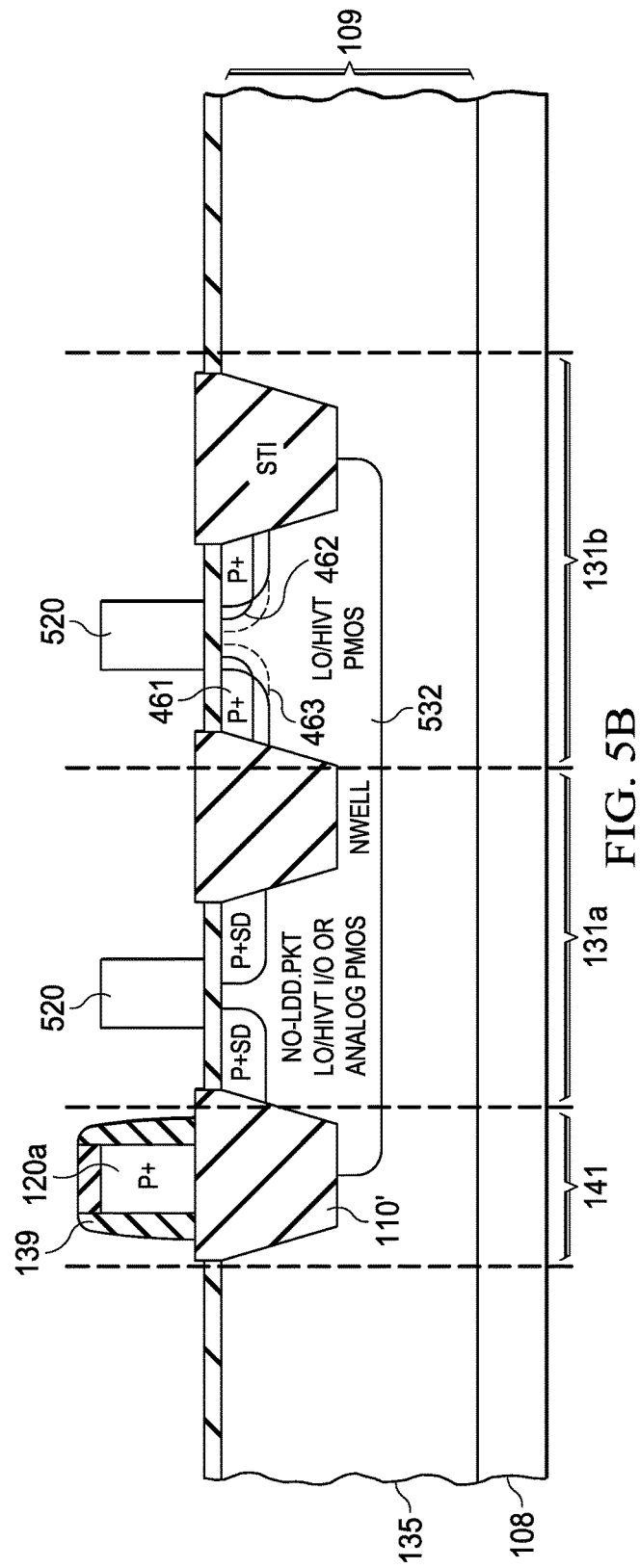

FIGS. 5A-5B show a variant of the process flow shown in FIGS. 4A-4D for forming both replacement metal gate low Vt and high Vt PMOS transistors. FIG. 5A tracks FIG. 4D described above. The nwell is shown as 532. FIG. 5B shows removal of the gate $120b_1$ over CMOS device area 131a and the gate $120b_2$ over CMOS device area 131b (while protecting polysilicon resistor 120a), and replacement gates with replacement gate PMOS gate material 520.

Figure 6A:
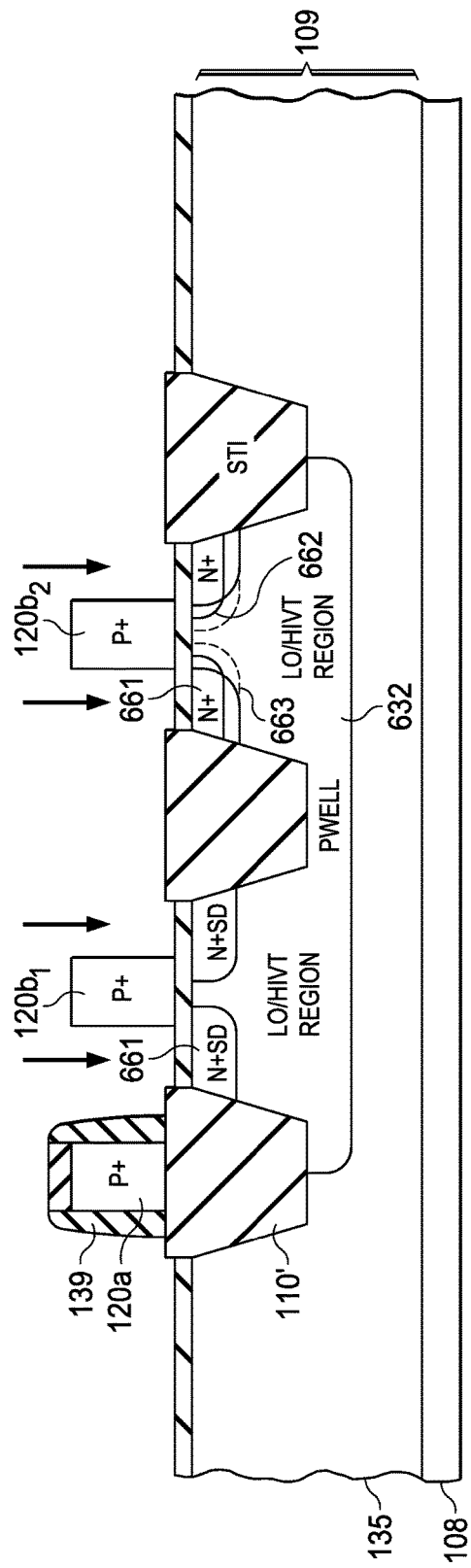
FIGS. 6A-6B show a variant of the process flow shown in FIGS. 4A-4D for forming both replacement metal gate low Vt and high Vt NMOS transistors, according to an example embodiment.
Figure 6B:
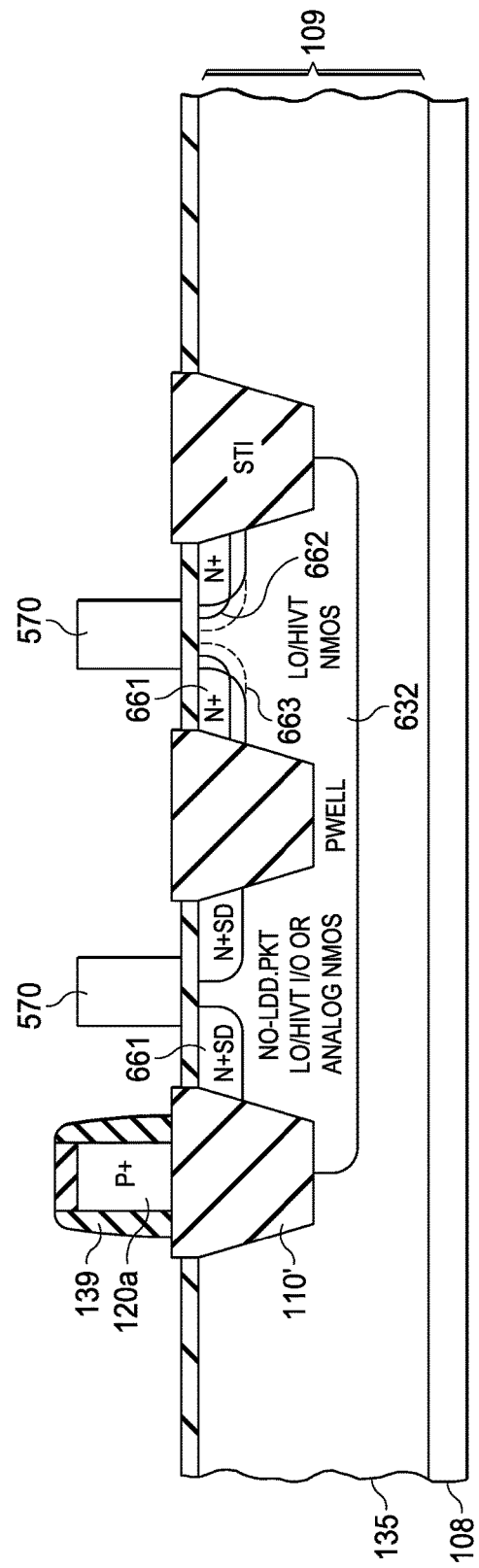

FIGS. 6A-6B show a variant of the process flow shown in FIGS. 4A-4D for forming both replacement metal gate low Vt and high Vt NMOS transistors. FIG. 6A tracks FIG. 4D described above except reverse the doping type in the semiconductor surface layer 109. The pwell is shown as 632. NSD regions 661, NLDD regions 662 and pocket regions 663 are shown. FIG. 6B shows removal of the gate $120b_1$ over CMOS device area 131a and gate $120b_2$ over CMOS device area 131b (while protecting polysilicon resistor 120a), and replacement gates with a replacement gate NMOS gate material 570.

Regarding forming devices other than bipolars in the BSD device area 121, for example, to form an SCR a disclosed NPN bipolar transistor having a SIBLK material (such as shown in FIG. 2D as 139) can add an additional PSD (P+) contact to the nwell 135. A Schottky diode can be formed comprising a silicide contact on a lightly doped $I_2$ implanted region which does not receive either an NSD (n+) or PSD (p+) implant. A p-channel JFET can be formed from adding an n-type gate into the pbase 122 of the in-process device shown in the BSD device area 121.

One distinctive feature believed to be unique for ICs fabricated using disclosed methods including a single mask level having both a polysilicon resistor implant and a thru-gate ion implant, is that due to the thru-gate implant the isolation dielectric in the resistor area 141 under the polysilicon resistor 120a has a dopant gradient and a significant surface dopant concentration. Specifically, the top 0.1 µm portion of the isolation dielectric (such as STI 110') has a peak boron or n-type dopant concentration of at least $1 \times 10^{17}$ cm$^{-3}$ and a bottom 0.1 µm portion of the isolation dielectric has a peak boron or n-type dopant concentration of less than (<) $1 \times 10^{14}$ cm$^{-3}$.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. An integrated circuit (IC), comprising:
a substrate having a semiconductor surface layer thereon;
a field dielectric in a portion of the semiconductor surface layer including a bipolar or Schottky diode (BSD) class device area having at least one BSD class device, a CMOS transistor area including a PMOS transistor and a NMOS transistor each including a gate, and a resistor area having a polysilicon resistor comprising a polysilicon layer over the field dielectric;
wherein the polysilicon resistor is doped with a first dopant, and
wherein the field dielectric in the resistor area under the polysilicon resistor has a dopant gradient, the dopant gradient comprising a top 0.1 μm portion of the field dielectric having at least one of a peak boron and n-type dopant concentration of at least $1\times10^{17}$ cm$^{-3}$ and a bottom 0.1 μm portion of the field dielectric having at least one of a peak boron and n-type dopant concentration of less than (<) $1\times10^{14}$ cm$^{-3}$.

2. The IC of claim 1, wherein the field dielectric comprises trench isolation and wherein the polysilicon resistor is on top of the trench isolation.

3. The IC of claim 1, wherein the polysilicon resistor has average boron concentration of at least $10^{19}$ cm$^{-3}$.

4. The IC of claim 1, wherein the BSD class device includes at least one of a vertical NPN bipolar transistor and a vertical PNP bipolar transistor.

5. The IC of claim 1, wherein the CMOS transistor area includes at least a first PMOS transistor and a second PMOS transistor, the first PMOS transistor and the second PMOS transistor having a difference in voltage thresholds (Vt) of at least (>) 50 mV.

6. The IC of claim 1, wherein the gate comprises a metal gate.

7. The IC of claim 1, wherein a thickness of the polysilicon layer is from 50 nm to 250 nm.

8. The IC of claim 7, wherein the polysilicon resistor is a Zero Temperature Coefficient Resistor (ZTCR) having a TCR at 25° C. of from −100 ppm to +100 ppm.

9. The IC of claim 1, further comprising polysilicon capacitors comprising the polysilicon layer in the CMOS transistor area.

10. An integrated circuit (IC), comprising:
a substrate having a semiconductor surface layer;
a field dielectric in a portion of the semiconductor surface layer including a bipolar or Schottky diode (BSD) class device area having at least one BSD class device, a CMOS transistor area including a PMOS transistor and a NMOS transistor each including a gate, and a resistor area having a polysilicon resistor comprising a polysilicon layer over the field dielectric;
wherein the polysilicon resistor is doped with a first dopant, and
wherein the field dielectric in the resistor area under the polysilicon resistor has a dopant gradient from a higher dopant concentration near a surface of the field dielectric and a lower dopant concentration in a portion of the field dielectric opposite the surface, wherein the higher dopant concentration is at least 1000 times the lower dopant concentration.

11. The IC of claim 10, wherein a thickness of the polysilicon layer is from 50 nm to 250 nm.

12. The IC of claim 11, wherein the polysilicon resistor is a Zero Temperature Coefficient Resistor (ZTCR) having a TCR at 25° C. of from −100 ppm to +100 ppm.

13. The IC of claim 10, wherein the field dielectric comprises trench isolation and wherein the polysilicon resistor is on top of the trench isolation.

14. The IC of claim 10, wherein the polysilicon resistor has average boron concentration of at least $10^{19}$ cm$^{-3}$.

15. An integrated circuit (IC), comprising:
a substrate having a semiconductor surface layer thereon;
a field dielectric in a portion of the semiconductor surface layer; and
a polysilicon resistor comprising a polysilicon layer over the field dielectric;
wherein the polysilicon resistor is doped with a first dopant, and
wherein the field dielectric under the polysilicon resistor has a dopant gradient, the dopant gradient comprising a top 0.1 μm portion of the field dielectric having at least one of a peak boron and n-type dopant concentration of at least $1\times10^{17}$ cm$^{-3}$ and a bottom 0.1 μm portion of the field dielectric having at least one of a peak boron and n-type dopant concentration of less than (<) $1\times10^{14}$ cm$^{-3}$.

16. The IC of claim 15, wherein a thickness of the polysilicon layer is from 50 nm to 250 nm.

17. The IC of claim 16, wherein the polysilicon resistor is a Zero Temperature Coefficient Resistor (ZTCR) having a TCR at 25° C. of from −100 ppm to +100 ppm.

18. The IC of claim 15, wherein the field dielectric comprises trench isolation and wherein the polysilicon resistor is on top of the trench isolation.

19. The IC of claim 15, wherein the polysilicon resistor has average boron concentration of at least $10^{19}$ cm$^{-3}$.

* * * * *